(12) United States Patent
Burton

(10) Patent No.: US 7,598,630 B2
(45) Date of Patent: Oct. 6, 2009

(54) IC WITH ON-DIE POWER-GATING CIRCUIT

(75) Inventor: Edward Burton, Hillsboro, OR (US)

(73) Assignee: Intel Corporation, Santa Clara, CA (US)

( * ) Notice: Subject to any disclaimer, the term of this patent is extended or adjusted under 35 U.S.C. 154(b) by 230 days.

(21) Appl. No.: 11/193,276

(22) Filed: Jul. 29, 2005

(65) Prior Publication Data

US 2007/0023878 A1    Feb. 1, 2007

(51) Int. Cl.
*H01H 9/54* (2006.01)
*H01L 23/48* (2006.01)
*H01L 23/52* (2006.01)

(52) U.S. Cl. ..................................... 307/140
(58) Field of Classification Search ............... 307/140
See application file for complete search history.

(56) References Cited

U.S. PATENT DOCUMENTS

| | | | |
|---|---|---|---|
| 4,588,903 A | 5/1986 | Johnson | |
| 4,893,227 A | 1/1990 | Gallios et al. | |
| 6,150,724 A * | 11/2000 | Wenzel et al. | 257/777 |
| 6,424,128 B1 | 7/2002 | Hiraki et al. | |
| 6,452,247 B1 | 9/2002 | Gardner | |
| 6,577,535 B2 | 6/2003 | Pasternak | |
| 6,600,296 B2 | 7/2003 | Hazucha | |
| 6,693,412 B2 | 2/2004 | Ruan et al. | |
| 6,754,086 B2 | 6/2004 | Harris et al. | |
| 6,873,136 B2 | 3/2005 | Chagny | |
| 7,026,797 B2 | 4/2006 | McCune et al. | |
| 7,034,344 B2 * | 4/2006 | Pavier et al. | 257/135 |
| 7,110,266 B1 | 9/2006 | Porter et al. | |
| 7,202,648 B2 | 4/2007 | Gardner et al. | |
| 2003/0090255 A1 | 5/2003 | Bassett et al. | |
| 2003/0128602 A1 | 7/2003 | Nishimoto et al. | |
| 2003/0168748 A1 | 9/2003 | Katagiri et al. | |
| 2003/0189460 A1 | 10/2003 | Wang et al. | |
| 2003/0209809 A1 | 11/2003 | Lasky et al. | |
| 2004/0124510 A1 | 7/2004 | Piorun et al. | |
| 2004/0240309 A1 | 12/2004 | Piorun et al. | |
| 2005/0006750 A1 | 1/2005 | Pavier et al. | |
| 2006/0006432 A1 * | 1/2006 | Shiraishi et al. | 257/288 |

(Continued)

FOREIGN PATENT DOCUMENTS

EP    1376692 A2    1/2004

(Continued)

OTHER PUBLICATIONS

"PCT/US2006/026381 Written Opinion", (Dec. 4, 2006), 11 pages.

(Continued)

*Primary Examiner*—Albert W Paladini
*Assistant Examiner*—Hal I Kaplan
(74) *Attorney, Agent, or Firm*—Ryder IP Law; Douglas J. Ryder (57) ABSTRACT

In some embodiments a semiconductor device is described that includes, on a single die, both a functional circuit and a power-gating circuit. The power-gating circuit may be used to control the power delivered to core circuit elements on the semiconductor device. The power may be provided to and possibly from the power-gating circuit using underutilized die connection elements. Other embodiments are otherwise disclosed herein.

30 Claims, 8 Drawing Sheets

U.S. PATENT DOCUMENTS

2006/0091871 A1    5/2006    Abedinpour et al.
2006/0279267 A1    12/2006    Burton et al.

FOREIGN PATENT DOCUMENTS

| WO | 0103279 A1 | 1/2001 |
|---|---|---|
| WO | 03100831 A2 | 12/2003 |
| WO | 2004/102623 | 11/2004 |
| WO | WO-2004102623 A2 | 11/2004 |
| WO | WO-2005038920 A2 | 4/2005 |

OTHER PUBLICATIONS

Burton, Edward, "IC With On-Die Power-Gating Circuit", filed Jul. 29, 2006 assigned U.S. Appl. No. 11/193,276.

Abedinpour, S. "DC-DC Power Converter for Monolithic Implementation", Department of Electrical Engineering and Computer Science, (2000), p. 2471-2475, May 2000.

Carley, L. R., "A Completely On-Chip Voltage Regulation Technique for Low Power Digital Circuits", 3 pages, 1999.

Kim, Jaeha "Adaptive Supply Serial Links with Sub-1-V Operation and Per-Pin Clock Recovery", IEEE Journal of Solid-State Circuits, vol. 37, No. 11, (Nov. 2002), pp. 1403-1413.

Abedinpour, Siamak "Monolithic Distributed Power Supply for a Mixes-Signal Integrated Circuit", (2003), III-308-III-311, Mar. 2003.

Hazucha, Peter "A 233MHz, 80-87% Efficient, Integrated, 4-Phase DC-DC Converter in 90nm CMOS", 2004 Symposium on VLSI Circuits Digest Technical Papers, (2004), pp. 256-257, Sep. 2004.

\* cited by examiner

IC WITH ON-DIE POWER-GATING CIRCUIT

BACKGROUND

Growing demand for integrated circuits (ICs), especially microprocessors, with ever higher levels of performance and functionality have driven these devices to circuit densities beyond 100 million transistors per die. And this number may soon exceed one billion transistors on a single die. The growth in transistor density has been made possible by the use of MOSFET transistors with gate lengths below 100 nm. As gate length has shortened, power supply voltages have fallen, in some cases, to below 1 V.

High-speed microprocessors, with clock speeds above 3 GHz, may require in excess of 100 watts of power when operating at peak load. With operating voltages below 1 V, this translates to power supply currents that reach beyond 100 A. Additionally, the current requirements may change from idle (<20 A) to full power in a small number of clock cycles, leading to current transitions (di/dt) exceeding 30 GA/s.

In many applications, these high power integrated circuits operate at a very low duty cycle. For example, a microprocessor in a computer running a word processing application may only be required to operate for a few milliseconds each time a key on the user's keyboard is struck (less than once every 100 milliseconds). This is equivalent to a duty cycle of a few percent or less. In such applications, there is an opportunity to save significant power by slowing or stopping the microprocessor clock and reducing the supply voltage to minimize leakage current. Saving power is especially important in battery-powered devices such as PDAs, cellphones, laptop computers, and the like.

More recently, with the advent of so-called "multicore" processors (two or more processing units on a single die), there is an additional need (as well as opportunity) to reduce operating power during idle periods on one or more of the processing cores.

Integrated circuits are typically powered from one or more DC supply voltages provided by external supplies and high-efficiency, programmable DC-to-DC power converters located near the IC package. The power is provided through pins, leads, lands, or bumps on the integrated circuit package. Traditionally, to reduce the power to an integrated circuit, the power supply would be instructed, through its programming input, to reduce the supply voltage to a low level (often below 0.5 volts) or to zero volts. Because power converters have output filter and decoupling capacitance as high as several millifarads, power cycling much beyond 100 Hz will not yield significant power savings.

BRIEF DESCRIPTION OF THE DRAWINGS

The features and advantages of the various embodiments will become apparent from the following detailed description in which.

DETAILED DESCRIPTION

Figure 1:
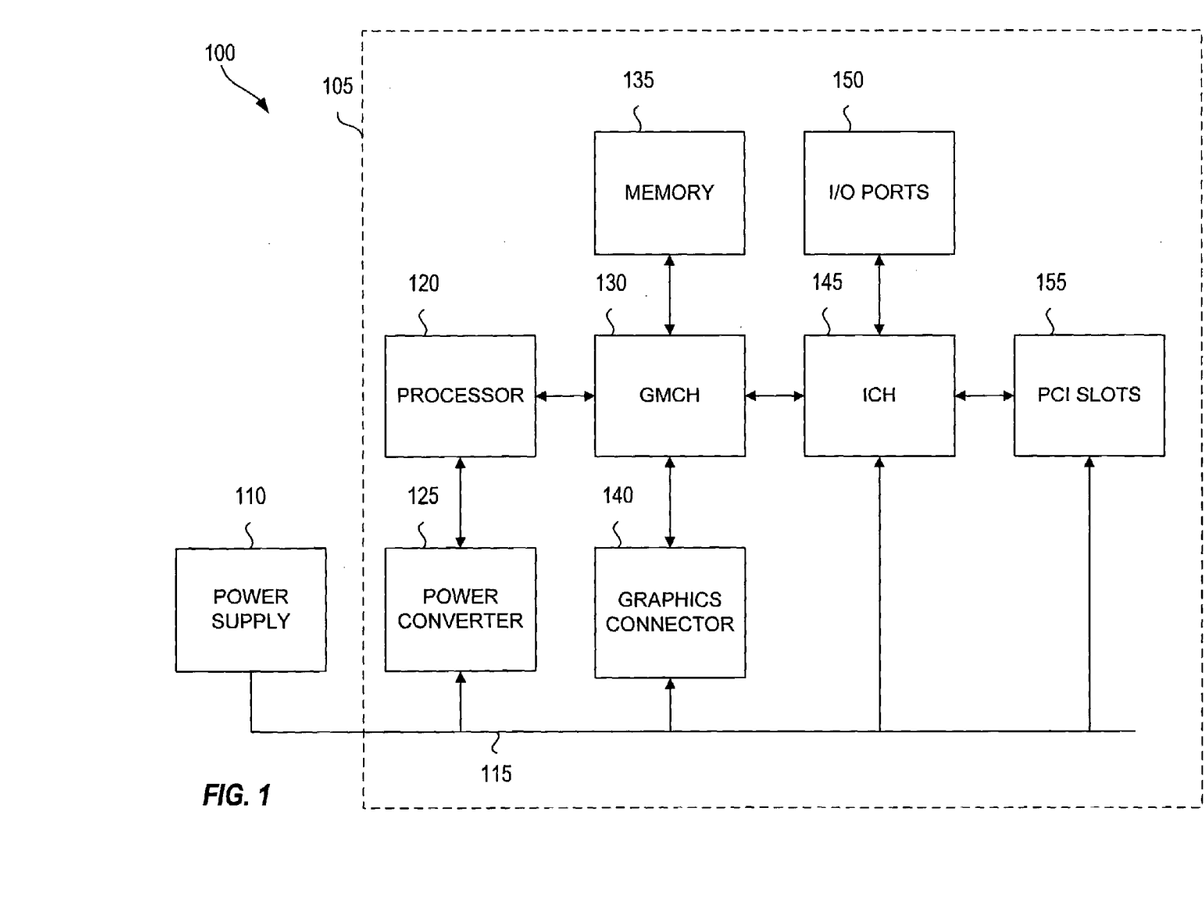
FIG. 1 illustrates a simplified system block diagram of a personal computer, according to one embodiment.

FIG. 1 is a simplified block diagram of an example microprocessor-based computer system 100. The computer system 100 includes a motherboard 105 and a power supply 110. The motherboard 105 contains all of the core processing and interface components for the computer system 100. Other components typically used in the computer system 100, but not illustrated, include a hard disk drive, an optical disk drive (e.g., CD-ROM, DVD-ROM), a network interface, a video/graphics adapter, a video monitor, and a keyboard. The power supply 110 transforms AC input from a wall outlet or other primary supply to one or more DC voltages (illustrated as power bus 115) appropriate for use by the motherboard 105, as well as other components in computer system 100.

The motherboard 105 includes a processor 120 (sometimes called a Central Processing Unit (CPU)), one or more power converters 125, a graphics/memory controller hub (GMCH) 130, system memory 135, a graphics connector 140, an input/output (I/O) controller hub (ICH) 145, I/O ports 150, and Peripheral Component Interconnect bus (PCI) slots 155 adhering to the PCI Local Bus Specification Revision 2.1 developed by the PCI Special Interest Group of Portland, Oreg. The combination of the GMCH 130 and the ICH 145 are often referred to as a "PC Chip Set," or simply, "Chip Set". In one embodiment, the processor 120 is from the Intel® family of processors, including the Pentium® II, Pentium® III, Pentium® IV, Pentium® 4 Processor-M, and Itanium processors available from Intel Corporation of Santa Clara, Calif. In another embodiment, processor 120 is a "multicore" processor, comprising two or more processing units on a single die. In alternate embodiments, other processors may be used.

The GMCH 130 may include a memory controller that couples the system memory 135 to the processor 120. The system memory 135 stores data and program instructions that may be executed by the processor 120. The system memory 135 may include dynamic random access memory (DRAM) or may be implemented using other memory types. The GMCH 130 may also include a high-speed video/graphics interface such as the Accelerated Graphics Port (AGP) adhering to the AGP V3.0 Interface Specification Revision: 1.0 developed by Intel Corporation of Santa Clara, Calif. or the PCI Express™ interface adhering to the PCI Express Base Specification 1.1 developed by the PCI Special Interest Group of Portland, Oreg.

The ICH 145, coupled to the GMCH 130, provides an interface to most I/O devices within the computer system 100.

The ICH 145 may be coupled to one or more I/O ports 150. The I/O ports 150 may include RS-232 serial ports, parallel ports, and Universal Serial Bus (USB) ports. USB ports are specified by the Universal Serial Bus Revision 1.1 specification or the Universal Serial Bus Revision 2.0 specification, both from the USB Implementers Forum, Inc. of Portland, Oreg. The ICH 145 may also be coupled to one or more of the PCI slots 155. The ICH 145 provides a bridge from the processor 120 to peripheral equipment and peripheral cards (not illustrated) that may be connected to one or more I/O ports 150 or plugged into one or more PCI slots 155.

The processor 120 requires at least one core supply voltage input that varies depending on the particular technology, speed, and other characteristics of the processing core. To accommodate the needs of various processors, the one or more power converters 125 (also called DC-to-DC converters or voltage regulators), convert one or more of the voltages from the power bus 115 to the voltages required for the particular processor 120.

The processor 120, in some embodiments, may require peak power over 100 watts, with an average power demand below 20 watts. In other embodiments, the processor 120 may have a peak power requirement of between 25 and 40 watts, with an average power demand of about one watt (e.g., processors for mobile applications).

Figure 2A:
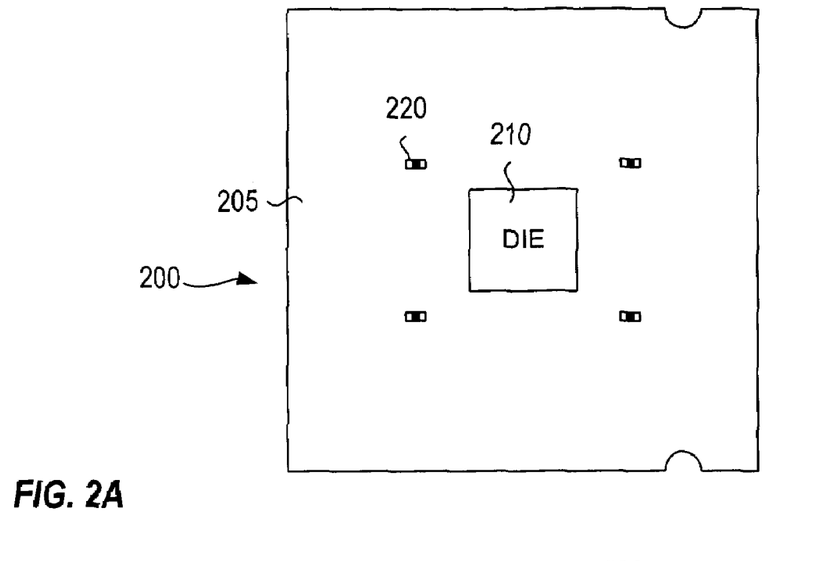
FIG. 2A illustrates a top view of an example integrated circuit, according to one embodiment.
Figure 2B:
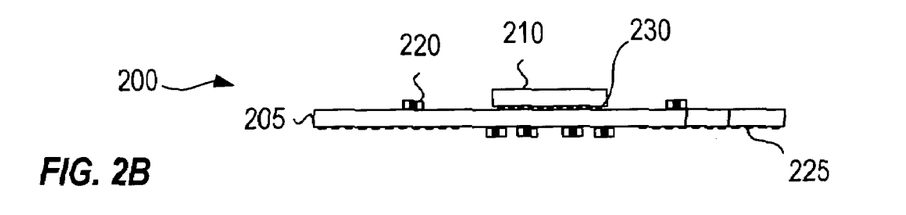
FIG. 2B illustrates an edge view of an example integrated circuit, according to one embodiment.
Figure 2C:
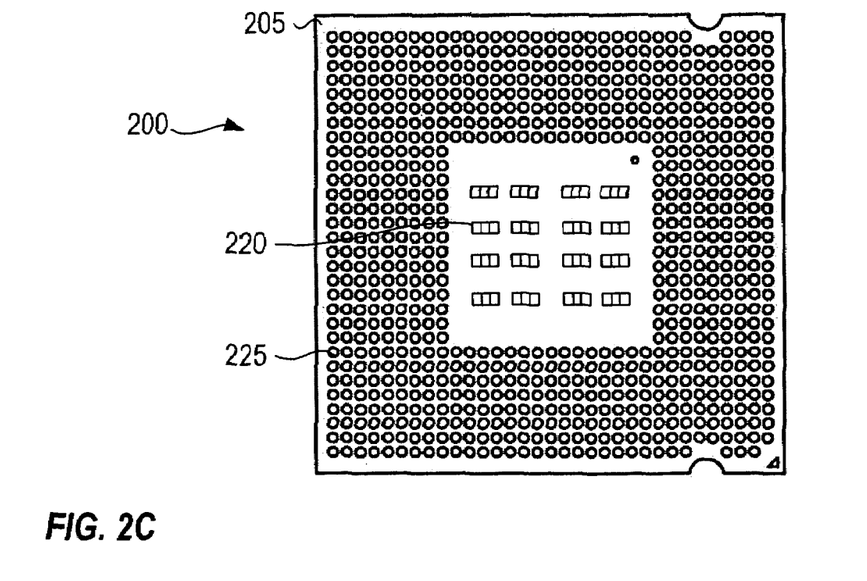
FIG. 2C illustrates a bottom view of an example integrated circuit, according to one embodiment.

FIGS. 2A-C illustrate several views of a typical integrated circuit 200 (for example, the processor 120 in FIG. 1). FIG. 2A illustrates an example of a top view of the integrated circuit 200, including a package substrate 205, a die 210, and one or more passive components 220 (capacitors, resistors, and/or inductors). The passive components 220 may be mounted on or contained within the package substrate 205. The die 210 illustrated in FIG. 2A is of a type known as a "flip-chip". A flip-chip die has die connection elements on one face of the die 210 and is surface mounted on the package substrate 205. In one embodiment, the die 210 has the die connection elements formed "over" the underlying die circuitry as a large plurality of Controlled Collapse Chip Connection (C4) bumps (illustrated in FIG. 2B as 230). The C4 bumps are typically fabricated from Lead/Tin (Pb/Sn) solder that has been evaporatively deposited or plated onto the die face. A die 210 with C4 bumps may be reflow soldered onto the package. In other embodiments, the die 210 may use wire-bond technology or Tape Automated Bonding (TAB) to connect the die 210 to the package substrate 205.

FIG. 2B illustrates an edge view of the integrated circuit 200 showing the package substrate 205, the die 210, the passive components 220, and C4 bumps 230. FIG. 2C illustrates an example bottom view of the integrated circuit 200 showing the bottom of the package substrate 205, including a plurality of interconnections 225 and passive components 220. The interconnections 225 provide a means for connecting electrical signals from the die 210 (not illustrated in FIG. 2C) to other electronic components on a circuit board or other substrate (e.g., the power converter 125, the GMCH 130). FIG. 2C illustrates a "Land-Grid-Array" (LGA) package in which the interconnections 225 are "lands". An LGA package may be inserted into a socket mounted on a circuit board (for example, motherboard 105 in FIG. 1). In other embodiments, the interconnections 225 may be pins, bumps, or balls.

The package substrate 205 may provide connections between selected C4 bumps 230 on the die 210 and selected interconnections 225, passive components 220 mounted on or contained within the package substrate 205, and/or active surface-mounted components (e.g., transistors, other integrated circuits (not shown)).

Figure 3A:
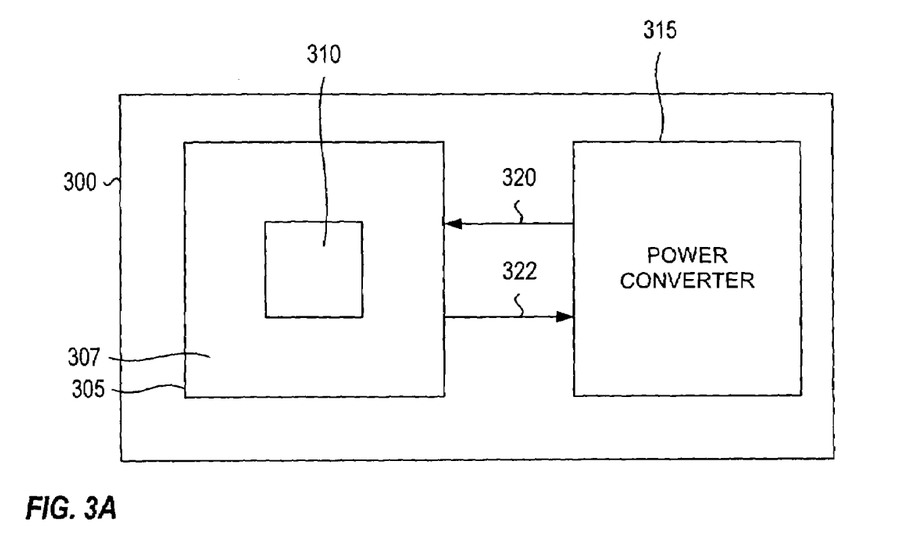
FIG. 3A illustrates an example integrated circuit with an external power converter, according to one embodiment.

FIG. 3A illustrates an example circuit board 300 having one or more power converters 315 external to an integrated circuit 305 contained thereon. The integrated circuit 305 includes a package substrate 307 and die 310. The power converter 315 may be implemented with discrete components mounted on the circuit board 300, external to the integrated circuit 305. The power converter 315 provides one or more supply voltages 320 to the integrated circuit 305. In some embodiments, the integrated circuit 305 may feed information 322, in the form of analog and/or digital signals, to the power converter 315. The information 322 may be used by the power converter 315 to set one or more parameters (e.g., voltage levels of the supply voltages 320).

Figure 3B:
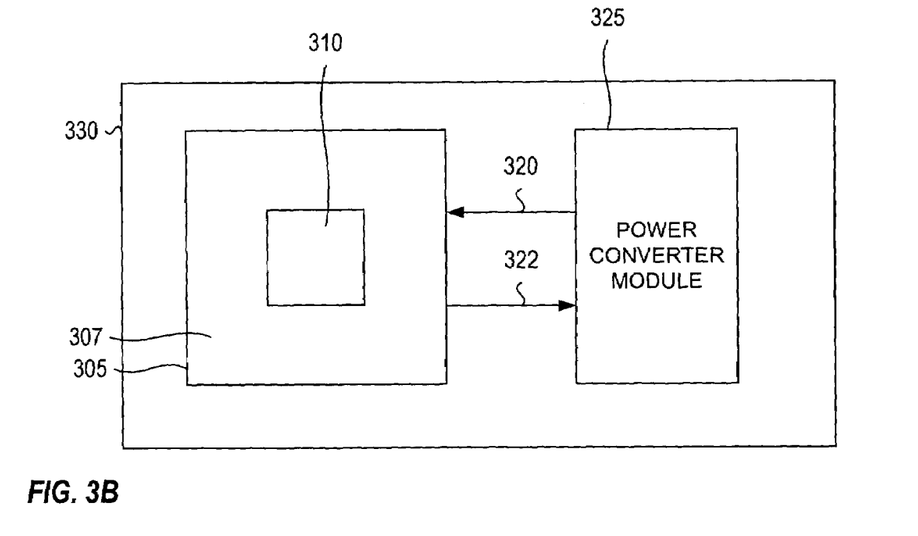
FIG. 3B illustrates an example integrated circuit with an external power converter module, according to one embodiment.

FIG. 3B illustrates an example circuit board 330 having one or more power converter modules 325 external to an integrated circuit 305 (package substrate 307 and die 310) contained thereon. The power converter module 325 may be implemented on a separate circuit board or other substrate that is plugged into or solder mounted onto the circuit board 330. The power converter module 325 is external to the integrated circuit 305 and provides one or more supply voltages 320 to the integrated circuit 305 and may receive information 322 from the integrated circuit 305.

An integrated circuit need not be fully powered at all times. For example, the integrated circuit may operate in a sleep mode at times (e.g., while waiting for a particular action). Portions of the integrated circuit (e.g., non operating cores on a multi-core integrated circuit) may be powered down, or put into a reduced power state by lowering one or more supply voltages and/or by reducing, or in some cases stopping, the clock frequency of the integrated circuit. This power reduction may be done intermittently or may be done on a periodic basis. For example, the integrated circuit may be kept in a powered down state while idle, and powered up periodically (for example, one every 0.1 to 10 milliseconds) to check peripheral devices (e.g., keyboards, mice, disk drives, etc.) for servicing needs. In order to control the application of the supply voltages, a power manager may be utilized.

Figure 4:
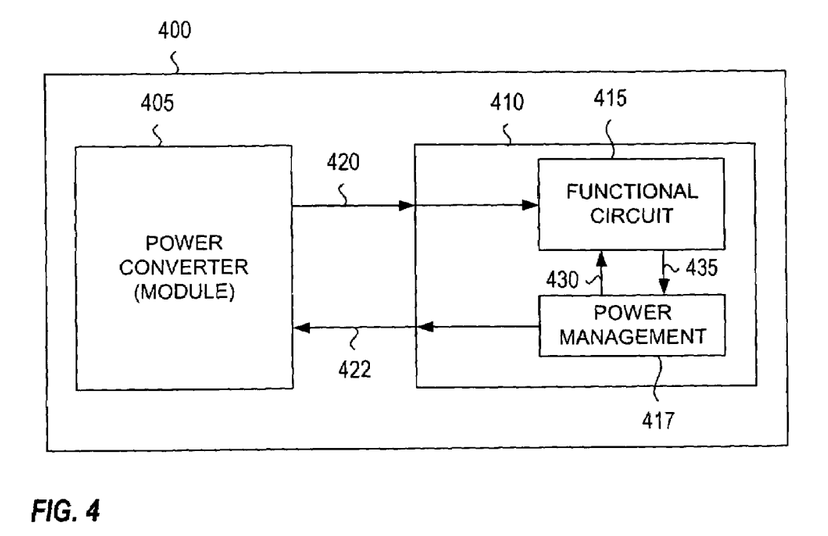
FIG. 4 illustrates an example power managed integrated circuit with an external power converter, according to one embodiment.

FIG. 4 illustrates an example circuit board 400 where a power manager (power management circuit) 417 located on an integrated circuit 410 (package substrate and die) controls application of supply voltages 420 from a power converter 405 (e.g., 315 of FIG. 3A, 325 of FIG. 3B) to the integrated circuit 410. The die (not illustrated) includes a functional circuit 415. The power manager 417 may, in some embodiments, be integrated on the same integrated circuit die as the functional circuit 415. The power manager 417 may communicate with 430 and/or collect status information from 435 the functional circuit 415. The power manager 417 may utilize control information 422 to control the power converter 405. The power converter 405 may provide (route) the supply voltages 420 directly to the functional circuit 415 (e.g., through an integrated circuit package (substrate)).

The power converter (module) 405 may have one or more filter and/or decoupling capacitors for each of the supply voltages 420. To achieve a high quality supply voltage (low ripple, low sensitivity to sudden changes in load), the power converter (module) 405 may require capacitors having a large total capacitance (e.g., well above one millifarad (1 mF)). During power cycling, a large amount of power may be expended to charge and discharge these capacitors. In some embodiments (e.g., microprocessors used for mobile applications), the power required to charge/discharge the capacitors might be similar to an average power requirement of the functional circuit. In such applications, the power cycling is ineffective at reducing the processor power.

In one embodiment, improved power savings may be achieved through the use of an on-die power-gating circuit to control application of the supply voltages to the functional circuit. The use of an on-die power-gating circuit significantly reduces the capacitive charging and discharging cycles. In some embodiments, only the relatively small on-die decoupling capacitors experience these cycles. In other embodiments, both the on-die decoupling capacitors and the on-package decoupling capacitors will experience these charge-discharge cycles. In such embodiments, the sum of on-die and on-package decoupling capacitance is usually relatively small compared to the total filter and decoupling capacitance on the supply voltage lines.

Figure 5:
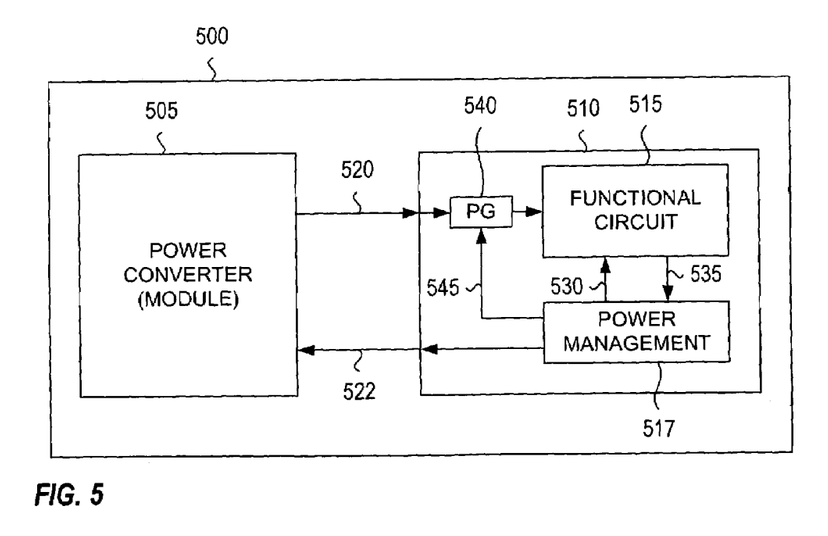
FIG. 5 illustrates an example power managed integrated circuit with an external power converter, according to one embodiment.

FIG. 5 illustrates an example circuit board 500 where supply voltages 520 from a power converter 505 are routed through a power gating circuit 540 located on an integrated circuit 510 (package substrate and die). The gating circuit 540 controls application of the supply voltages 520 to a functional circuit 515 located on the integrated circuit 510. The power-gating circuit 540 may include one or more power transistors (e.g., bipolar, MOSFET). The power-gating circuit 540 may be integrated on the same integrated circuit die as the functional circuit 515. A power manager (power management circuit) 517 controls the power converter 505 through control information 522 and the power-gating circuit 540 through power-gating signals 545. The power manager 517 may communicate 530, 535 with and may be integrated on the same integrated circuit die as the functional circuit 515. If the integrated circuit 510 has more than one functional circuit (multi-core processor) each core may have a separate power gating circuit 540 so that power to individual cores can be controlled.

The added circuitry (e.g., power transistors) and corresponding increase in die size to accommodate the power-gating circuit 540 may be justified based on the reductions in the capacitive charging and discharging cycles. However, in order to integrate the power-gating circuit 540 on the same die as the functional circuit 515, the integrated circuit die may need to be tailored to handle both the peak current (e.g., 100 amps) and the fastest current transitions (di/dt). This may require a significant increase in the die size to add sufficient die connection elements (e.g., C4 bumps) to support the provision of peak current and peak di/dt to the power-gating circuit 540. That is, the full functional circuit (core) supply current may need to be first delivered to the input node of the power-gating circuit 540 and then be delivered from the output node to the core. Conventional die-level metallization is normally too thin to transport this current laterally across the die, so locating the power-gating circuit 540 at the edge of the core, in one embodiment, implies the use of two large sets of die connection elements (input and output C4 bumps). Distributing the power-gating circuitry (transistors) throughout the core may eliminate one or more sets of die connection elements but spreads out the core, which raises the core power and lowers the core speed. This also tends to divert a large fraction of the metal resources from signals to power.

According to one embodiment, the core supply current may be provided to the on-die power-gating circuitry using underutilized die connection elements (e.g., C4 bumps). Underutilized C4 bumps may be found over die circuitry that requires significantly less power per unit area than other die circuitry. For example, in a microprocessor the power density for cache memory may be about 2% of the power density of the processing circuitry in the processor core. Accordingly, the cache memory may have an abundance of underutilized C4 bumps that may be used to carry current to, and in some embodiments, from the on-die power-gating circuitry.

In one embodiment, a portion of the underutilized C4 bumps may be used to supply ungated current to the input of the power-gating circuitry. In this embodiment, a thick on-die metal layer may be used to carry gated current from the output of the power-gating circuitry to the processor core. According to another embodiment, a portion of the underutilized C4 bumps may be used to supply ungated current to the input of the power-gating circuitry and another portion of the underutilized C4 bumps may be used to provide the gated current from the output of the power-gating circuitry back to the package for distribution to the core. This embodiment uses metal layers of a package to distribute the current to the core instead of requiring the die metal to distribute the gated current.

Figure 6A:
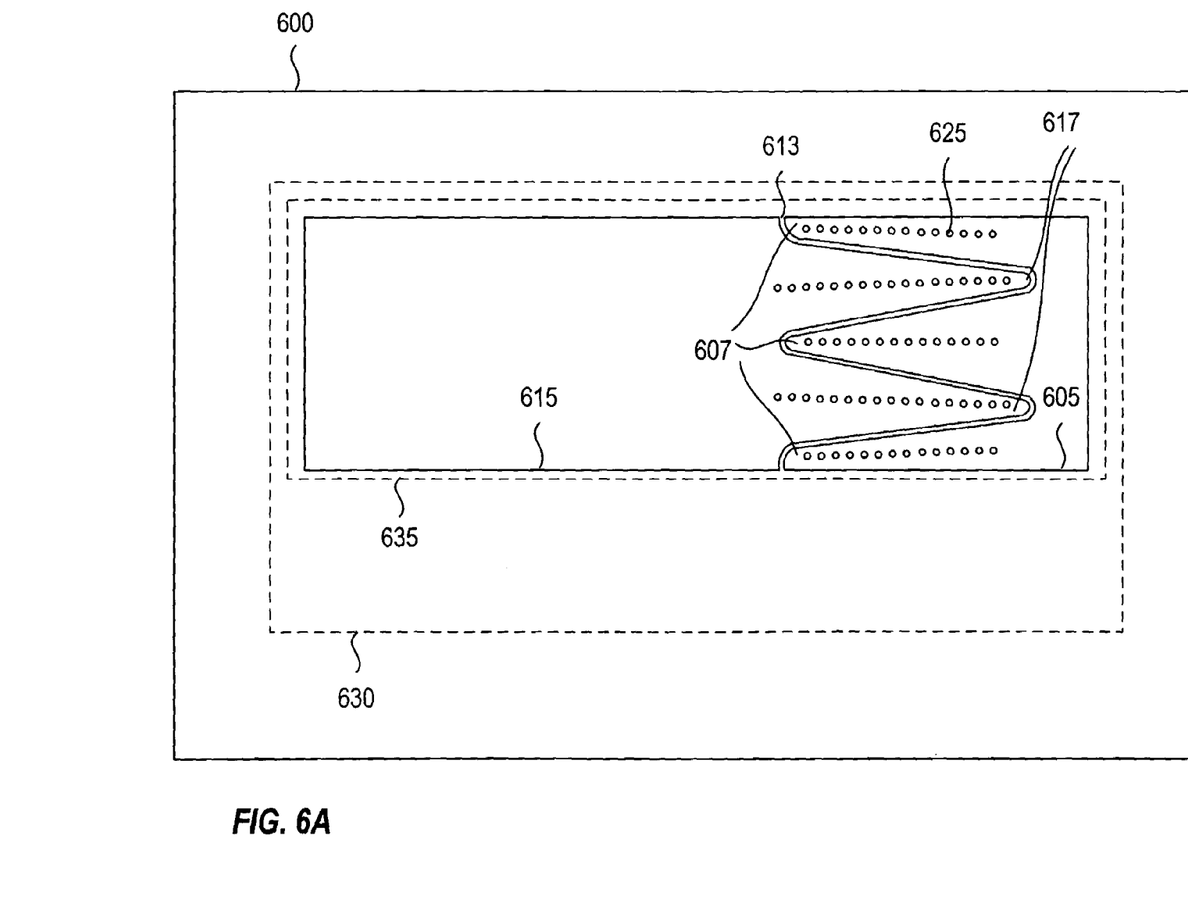
FIG. 6A illustrates an example integrated circuit package, according to one embodiment.
Figure 6B:
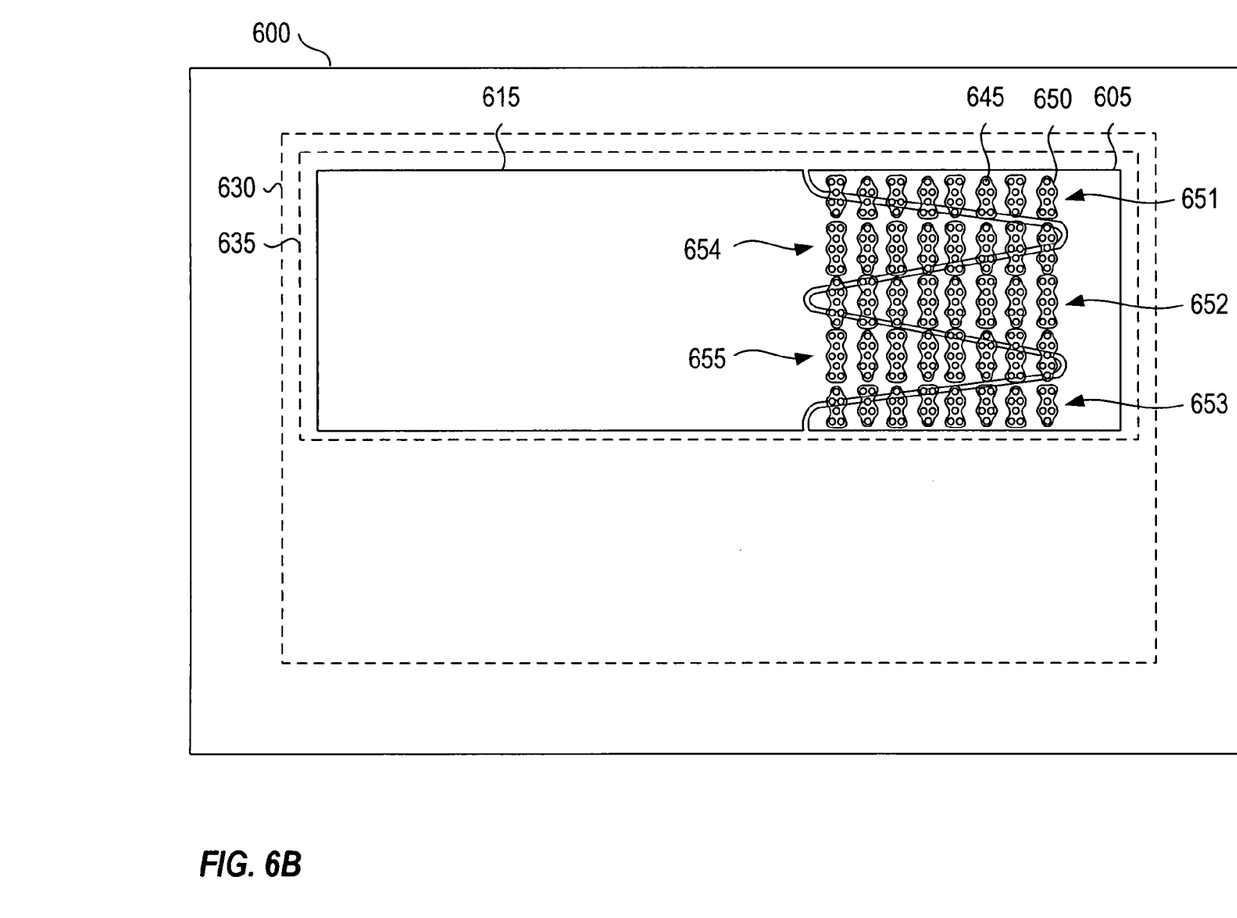
FIG. 6B illustrates an example top layer of an integrated circuit package, according to one embodiment.

FIGS. 6A-B illustrate an example integrated circuit package substrate 600 utilized to support on-die power-gating circuits. The substrate 600 may include supply conductors aligned with a core of a circuit die. For simplicity, the actual die and core as well as many package substrate 600 details (e.g., additional signal conductors, ground conductors, other power conductors) are not illustrated. For reference, the die and core outlines 630, 635 are indicated by dashed lines. It should be noted that a single core processor is illustrated for ease of explanation and the various embodiments described herein are not limited to a single core processors. Rather, other embodiments may include processors with more than one core (e.g., dual core) and a package substrate having supply conductors aligned with each core. The additional cores (functional circuits) may be contained on the same die or may be contained on separate die on the same package. Other embodiments may also include integrated circuits other than microprocessors.

FIG. 6A illustrates example supply conductors fabricated on or in an integrated circuit package substrate 600. The package substrate 600 may include ungated supply conductors 605. An on-die power-gating circuit (e.g., 540 in FIG. 5) may switchably interconnect ungated supply from the ungated supply conductors 605 to an on-die functional circuit (e.g., 515 in FIG. 5) using thick on-die metal to distribute the switched supply throughout the functional circuit. The package substrate 600 may also include gated supply conductors 615 that are separated from the ungated supply conductors 605 by a gap 613. In this embodiment, the on-die power-gating circuit switchably interconnects the supply from ungated supply conductor 605 to the gated supply conductor 615.

The package substrate 600 may be fabricated as a multi-layer ceramic or organic structure with two or more layers of conductors separated by insulating layers. The supply conductors (ungated 605 and gated 615) may include two or more conductor layers of the package substrate 600 stacked and aligned to one another and interconnected using vias 625. The supply conductors (ungated 605 and gated 615) may form interdigitated structures. As illustrated, the supply conductors (ungated 605 and gated 615) include one or more fingers 607, 617 respectively. It should be noted that the supply conductors are not limited to any number of fingers and need not be interdigitated at all.

In a multi-core integrated circuit the package substrate 600 may include supply conductors (e.g., 605, 615) aligned with each core. The on-die power-gating circuits may switchably interconnect ungated supply from the associated ungated supply conductors 605 to the associated on-die functional circuits (e.g., cores) or to the associated gated supply conductors 615.

FIG. 6B illustrates an example top conductive layer of the package substrate 600. The top layer includes a large plurality of C4 pads 645. When an integrated circuit die is attached to the package substrate 600, the C4 bumps on the integrated circuit die (e.g., 230 in FIG. 2B) are bonded (reflow soldered) onto the C4 pads 645. In one embodiment, two or more C4 pads 645 are connected to each other (clustered) and connected to the underlying supply conductors (ungated 605 or gated 615). The C4 pad clusters 650 are formed from two or more C4 pads 645 and arranged in rows. As illustrated, cluster rows 651, 652, and 653 are connected to the underlying ungated supply conductor 605 while cluster rows 654 and 655 are connected to the underlying gated supply conductor 615. According to one embodiment, the C4 pad clusters 650 and the interdigitated structure (fingers 607, 617 of FIG. 6A) provide for a well-balanced current density and help reduce resistive losses. It should be noted that the C4 pad clusters 650 are not limited to the amount or configuration illustrated.

Figure 7:
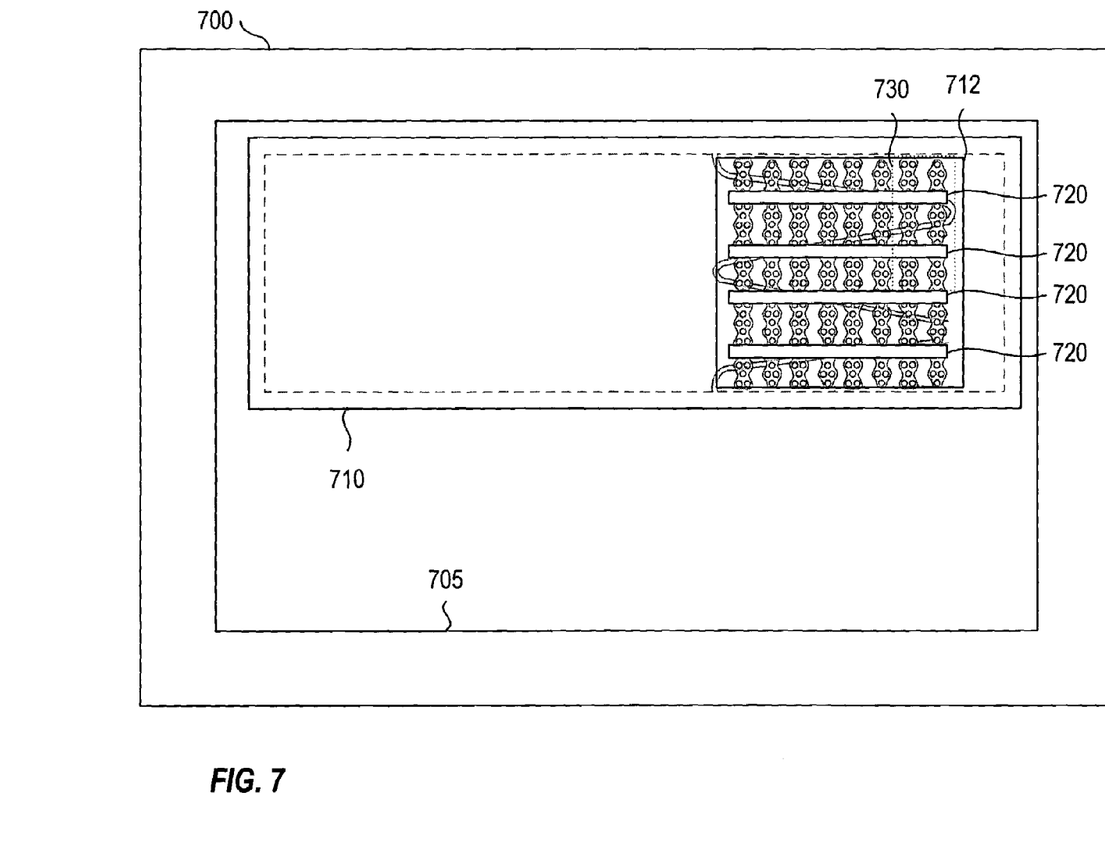
FIG. 7 illustrates an example integrated circuit die on an integrated circuit package, according to one embodiment.

FIG. 7 illustrates an example integrated circuit die 705 on top of a package substrate 700 (e.g., 600 of FIGS. 6A-B). The integrated circuit die 705 includes a core 710 that is aligned with the supply conductors (e.g., 605 and 615 of FIGS. 6A-B) of the package substrate 700. The supply conductors are illustrated with dashed lines to indicate they are behind the core 710 and are not marked with reference numbers for visual ease. The C4 pad clusters (e.g., 650) and the cluster rows (e.g., 651-655) located on the top conductive layer of the package substrate are lightly illustrated for clarity but are also not marked with reference numbers for visual ease.

The core 710 may be a microprocessor. The core may include cache memory 712, for example to enhance the operating performance of a microprocessor. The cache memory 712 may include one or more cache memory banks or arrays of memory cells (not illustrated). In one embodiment, a power-gating circuit 720 (MOSFET) may be embedded between banks of cache memory cells on the core 710. As illustrated, there are 4 FETs that may be embedded between five banks of memory cells. It should be noted that the various embodiments described herein are not limited to the amount of FETs or banks of memory cells or the exact configuration between them.

The placement of the power-gating circuits 720 in the cache memory 712 places a small number of power-gating circuits outside the core area, enabling them to efficiently handle the current from the entire core and effectively use thick on-die metal layers without diverting precious core metal resources from signals to power. Additionally, the cache memory 712 has an abundance of underutilized C4 bumps that may be used to carry current to and, in some embodiments, from the power-gating circuits 720 as the power density of the cache memory 712 may be only about 2% of the power density of the processor core 710.

The cluster rows described with respect to FIG. 6B may be aligned with the underutilized C4 bumps to enable the core supply current to flow from an ungated supply conductor (e.g., 605) to the power-gating circuit 720 and the gated supply current to flow from the power gating circuit 720 to the gated supply conductor (e.g., 615) where it may be distributed appropriately. This provides an efficient use of these underutilized C4 bumps.

Figure 8:
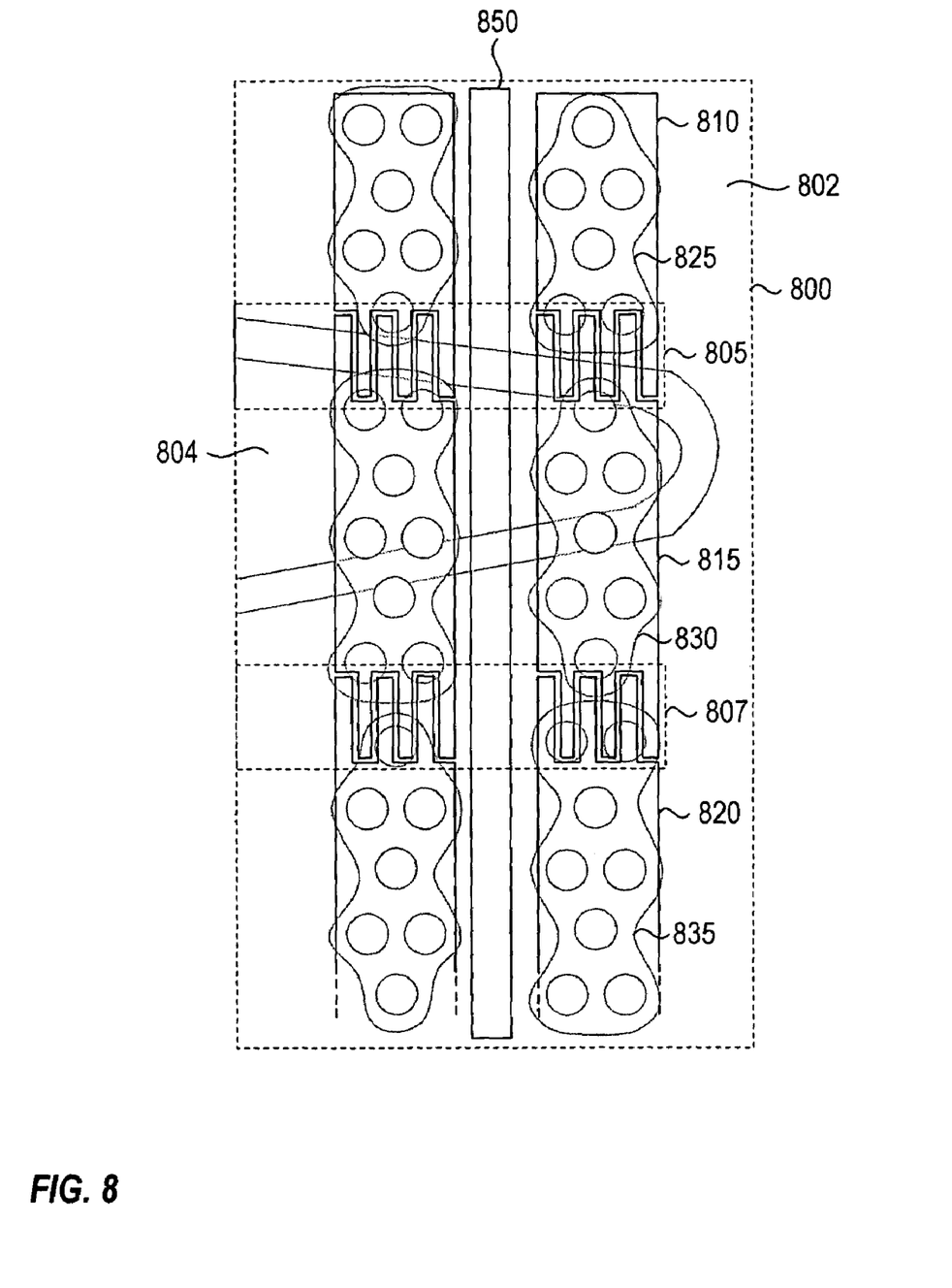
FIG. 8 illustrates further detail of an example integrated circuit die on an integrated circuit package, according to one embodiment.

FIG. 8 illustrates further detail of an example integrated circuit die 800 on an integrated circuit package. The detailed area of the die 800 illustrated may correspond to an area illustrated as dotted outline 730 (6 pad cluster in upper right corner) in FIG. 7. As with FIG. 7 the C4 pad clusters located on the top conductive layer of the package substrate are lightly illustrated to indicate they are below the die 800. The top conductive layer includes an ungated supply conductor 802 and a gated supply conductor 804 and three rows of pad clusters 825, 830, 835. The top row of pad clusters 825 and the bottom row of pad clusters 835 are connected to the ungated supply conductor 802, and the middle row of pad clusters 830 is connected to the gated supply conductor 804. The die 800 includes two power gating circuits 805, 807 and four thick on-die metal areas 810, 815, 820, 850 used to carry current. The thick on-die metal areas 810, 815, 820 may be used to spread the current into and out of the power-gating circuits 805, 807 to balance the current flow through individual C4 bumps to reduce or eliminate the occurrence of electromigration. The thick on-die metal areas 810, 815, 820 may be interdigitated with one-another over the power-gating circuits 805, 807 to improve current distribution to the power-gating circuitry.

The first thick on-die metal area 810 may be used to carry current across the cache memory area from the ungated supply conductor 802 (the first cluster of C4 bumps 825) to the power-gating circuitry 805. The second thick on-die metal area 815 may be used to carry current from the first and second power-gating circuits 805, 807 to the gated supply conductor 804 (the second cluster of C4 bumps 830). The third thick on-die metal area 820 may be used to carry current from the ungated supply conductor 802 (the third cluster of C4 bumps 835) to the power-gating circuitry 807.

The on-die thick metal area 850 may be used to route power for the on-die circuitry (e.g., cache memory) underlying the C4 bumps used to convey power to and from the power-gating circuits 805, 807. The on-die thick metal area 850 may route power to the underlying circuitry (not illustrated) from the power-gating circuits 805, 807 (gated supply current), the ungated supply conductor 802, or a power supply separate from the core power supply.

The embodiments described herein may be implemented on an integrated circuit having a single core or multiple cores. An embodiment having multiple cores may be implemented on a single die or multiple die. According to various embodiments, the integrated circuit may include processor die and separate off die memory, may not include any memory as the memory may be external to the integrated circuit, may include die having both a functional circuit and memory, or some combination thereof.

Although the various embodiments have been illustrated by reference to specific embodiments, it will be apparent that various changes and modifications may be made. Reference to "one embodiment" or "an embodiment" means that a particular feature, structure, or characteristic described in connection with the embodiment is included in at least one embodiment. Thus, the appearances of the phrase "in one embodiment" or "in an embodiment" appearing in various places throughout the specification are not necessarily all referring to the same embodiment.

Different implementations may feature different combinations of hardware, firmware, and/or software. It may be possible to implement, for example, some or all components of various embodiments in software and/or firmware as well as hardware, as known in the art. Embodiments may be implemented in numerous types of hardware, software and firmware known in the art, for example, integrated circuits, including ASICs and other types known in the art, printed circuit broads, components, etc.

The various embodiments are intended to be protected broadly within the spirit and scope of the appended claims.

What is claimed:
1. A computer comprising
an off-die memory device;
a processor die, comprising:

a plurality of die connection elements, wherein a first subset of the plurality of die connection elements receive power;

a processor circuit; and a power-gating circuit electrically connected between the first subset of die connection elements and the processor circuit, wherein a second subset that is at least a portion of the first subset of die connection elements are not over the power-gating circuit, and wherein the power-gating circuit controls the application of power to the processor circuit by switchably interconnecting the first subset of the die connection elements to the processor circuit; and a substrate having an ungated conductive area to electrically connect a power supply input to an input of the power-gating circuit via the first subset of the die connection elements; and a gated conductive area electrically connected to an output of the power-gating circuit via a third subset of die connection elements and to the functional circuit via a fourth subset of die connection elements that are above the functional circuit, wherein a fifth subset that is at least a portion of the third subset of die connection elements are not over the power-gating circuit.

2. The computer of claim 1, wherein power from the substrate is provided to and from the power-gating circuit via underutilized die connection elements.

3. The computer of claim 1, wherein the third subset of die connection elements and the fourth subset of die connection elements are connected via metal layers in the gated conductive area.

4. A semiconductor die, comprising:

a plurality of die connection elements formed on the semiconductor die;

a functional circuit including a plurality of devices formed in the semiconductor die and operating together to perform certain functions, wherein a portion of the functional circuit is formed above a first subset of the plurality of die connection elements that are not utilized to directly provide power or signals thereto; and a power-gating circuit formed in the semiconductor die and electrically connected between a power source and the functional circuit to control power provided to the functional circuit, wherein a connection between the power gating circuit and the power source is capable of handling peak current and peak current transitions associated with the functional circuit, and wherein the connection includes at least a second subset of the plurality of die connection elements and the second subset includes at least a portion of the first subset.

5. The die of claim 4, wherein the power-gating circuit includes one or more MOSFETs.

6. The die of claim 4, wherein the die connection elements are C4 bumps.

7. The die of claim 4, wherein the functional circuit is a microprocessor.

8. The die of claim 4, wherein the portion of the functional circuit includes at least one cache memory array.

9. The die of claim 4, wherein the power-gating circuit is at least partially formed in the portion of the functional circuit.

10. The die of claim 4, further comprising a power management circuit electrically connected to the power-gating circuit, wherein the power management circuit provides a gating signal for operating the power-gating circuit.

11. The die of claim 10, wherein the power management circuit is also electrically connected to the functional circuit.

12. The die of claim 4, wherein the functional circuit includes a plurality of functional circuits; and the power-gating circuit includes a plurality of power-gating circuits, wherein power being provided to each of the plurality of functional circuits is independently controlled by a corresponding one of the plurality of power-gating circuits.

13. The die of claim 12, wherein at least a subset of the plurality of functional circuits are microprocessors.

14. The die of claim 13, wherein respective ones of the plurality of power-gating circuits gate power to non-active microprocessors.

15. The die of claim 4, further comprising metal layers to electrically connect the power-gating circuit to the at least a portion of the first subset and to the functional circuit.

16. The die of claim 15, wherein the metal layers are interdigitated over the power-gating circuit.

17. A device, comprising:

a substrate;

a power supply input;

a conductive area, on or in the substrate, electrically connected to the power supply input; and a semiconductor die coupled to the substrate, the die including:

a semiconductor core including a plurality of devices formed in the semiconductor die and operating together to perform certain functions; and a power-gating circuit, electrically connected to the conductive area and the semiconductor core, to switchably provide power to the semiconductor core, wherein the power-gating circuit is electrically connected to the conductive area via die connection elements, wherein a first subset of the die connection elements are below the semiconductor core but are not utilized to directly provide power or signals thereto, and wherein the die connection elements are capable of handling peak current and peak current transitions associated with the semiconductor core.

18. The device of claim 17, wherein the power-gating circuit includes one or more MOSFETs.

19. The device of claim 17, wherein the die connection elements are C4 bumps.

20. The device of claim 17, wherein the semiconductor core is a microprocessor.

21. The device of claim 17, wherein the semiconductor core includes at least one cache memory array and at least a second subset of die connection elements are below the cache memory array, wherein the second subset includes at least a portion of the first subset.

22. The device of claim 17, wherein the conductive area includes an ungated conductive area to electrically connect the power supply input to the power-gating circuit; and a gated conductive area to electrically connect the power-gating circuit to the semiconductor core.

23. The device of claim 22, wherein the semiconductor core is electrically connected to the gated conductive area via die connection elements.

24. The device of claim 22, wherein the ungated conductive area and the gated conductive area are interdigitated.

25. The device of claim 22, wherein the ungated conductive area and the gated conductive area include clusters of pads for coupling to the semiconductor die.

26. The device of claim 22, wherein the semiconductor die further includes metal layers to electrically connect the power-gating circuit to the die connection elements associated with the ungated conductive area and the gated conductive area.

27. The device of claim 17, wherein
the-power-gating circuit includes a plurality of power-gating circuits; and
the semiconductor core includes a corresponding plurality of semiconductor cores, wherein power being provided to each of the plurality of semiconductor cores is independently controlled by a corresponding one of the plurality of power-gating circuits.

28. The device of claim 17, wherein the semiconductor die includes a plurality of semiconductor cores and said conductive area includes an associated plurality of conductive areas aligned with a corresponding semiconductor core.

29. A computer comprising:
an off-die memory device; and
a processor die, comprising:
a plurality of die connection elements;
a processor circuit; and
a power-gating circuit electrically connected between a first subset of die connection elements and the processor circuit, wherein the first subset includes a second subset of die connection elements that are below the processor circuit and are not utilized to provide power or signals thereto, wherein the power-gating circuit controls the application of power to the processor circuit by switchably interconnecting the first subset of the die connection elements to the processor circuit, and wherein the first subset of the die connection elements are capable of handling peak current and peak current transitions associated with the processor circuit.

30. The computer of claim 29, wherein the processor circuit includes at least one cache memory array, and wherein at least a portion of the second subset is positioned under the cache memory array.

* * * * *